(12) United States Patent
Yen et al.

(10) Patent No.: US 7,954,080 B2
(45) Date of Patent: May 31, 2011

(54) METHOD AND APPARATUS FOR DE-EMBEDDING ON-WAFER DEVICES

(75) Inventors: Hsiao-Tsung Yen, Tainan (TW); Tzu-Jin Yeh, Hsinchu (TW); Sally Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 573 days.

(21) Appl. No.: 12/042,606

(22) Filed: Mar. 5, 2008

(65) Prior Publication Data

US 2009/0224791 A1 Sep. 10, 2009

(51) Int. Cl.
*G06F 17/50* (2006.01)

(52) U.S. Cl. .................................................. 716/136

(58) Field of Classification Search .............. 716/1, 4–5, 716/50, 136; 324/763, 765; 257/48, 620; 438/18
See application file for complete search history.

(56) References Cited

U.S. PATENT DOCUMENTS

2008/0237586 A1* 10/2008 Sun et al. ........................ 257/48
2008/0265378 A1* 10/2008 Lee et al. ....................... 257/620

OTHER PUBLICATIONS

Hsiao Tsung Yen et al., "A Physical L2L De-embedding Method for Silicon-based Devices Application", TSMC R&D RF Spice Group, Taiwan, R.O.C., 4 pages.
Hsiao Tsung Yen et al., "A Physical L2L De-embedding Method for Silicon-based Devices Application", TSMC R&D RF Spice Group, Taiwan, R.O.C., 4 pages.
Volker Blaschke et al., "Accurate Inductance De-embedding Technique for Scalable Inductor Models", 2007 IEEE International Conference on Microelectronic Test Structures, Mar. 19-22, Tokyo, Japan, pp. 248-252.
Troels Emil Kolding et al., "Ground-Sheilded Measuring Technique for Accurate On-Wafer Characterization of RF CMOS Devices", IEEE International Conference on Microelectronic Test Structures, Mar. 2000, Kolding, Jensen and Larsen, pp. 246-251.
Ming-Hsiang Cho et al., "A novel cascade-based de-embedding method for on-wafer microwave characterization and automatic measurement", Microwave Symposium Digest, 2004 IEEE MTT-S International vol. 2, Issue , Jun. 6-11, 2004 pp. 1237-1240 vol. 2.
Jyh-Chyurn Guo et al., "A Broadband and Scalable Lumped Element Model for Fully Symmetric Inductors Under Single-Ended and Differentially Driven Operations", Electron Devices, IEEE Transactions on vol. 54, Issue 8, Aug. 2007 pp. 1878-1888.

* cited by examiner

*Primary Examiner* — Vuthe Siek
(74) *Attorney, Agent, or Firm* — Haynes and Boone, LLP

(57) ABSTRACT

A method and system for de-embedding an on-wafer device is disclosed. The method comprises representing the intrinsic characteristics of a test structure using a set of ABCD matrix components; determining the intrinsic characteristics arising from the test structure; and using the determined intrinsic characteristics of the test structure to produce a set of parameters representative of the intrinsic characteristics of a device-under-test ("DUT").

20 Claims, 2 Drawing Sheets

METHOD AND APPARATUS FOR DE-EMBEDDING ON-WAFER DEVICES

BACKGROUND

Integrated circuits (ICs) formed on semiconductor substrates include multiple active and passive components, such as resistors, inductors, capacitors, transistors, amplifiers, etc. Such components are fabricated to a design specification that defines the ideal physical/electrical characteristics the component will exhibit (e.g., resistance, inductance, capacitance, gain, etc.). Though it is desirable to verify that each component fabricated complies with its specific design specification, typically, after integration into a circuit, an individual component cannot be readily tested. Thus, "stand-alone" copies of the individual IC components, components fabricated with the same process and with the same physical/electrical characteristics as the IC components, are fabricated on the wafer; and it is assumed that the physical/electrical properties measured for the "stand-alone" copies represent those of the non-tested individual IC components.

During testing, the "stand-alone" copy, referred to as the "device-under-test" (DUT), is electrically connected to leads and test pads, which are further connected to external testing equipment. Though the physical/electrical properties measured should accurately represent those of the DUT (and the individual IC component represented), the test pads and leads contribute physical/electrical characteristics, known as "parasitics" (e.g., resistance, capacitance, and inductance from the test pads and leads), that contribute to the measured characteristics of the DUT. The parasitics are factored out or extracted by a process known as "de-embedding" to reveal the intrinsic characteristics of the DUT alone.

Thus, accurate de-embedding methods are required to eliminate the parasitic contributions and accurately describe the intrinsic characteristics of the DUT (and ultimately, the individual IC component represented). Currently, on-wafer de-embedding methods referred to as "open-short," "open-thru," and "thru-reflect-line" ("TRL") have been widely used to subtract parasitics such as resistance, inductance, and capacitance arising from the test pads and leads at high frequencies (up to the GHz level). However, each of these methods presents problems: (1) the open-short method results in over de-embedding of the inductance parasitics from the lead metal lines; (2) the open-thru method accuracy depends on model fitting quality, often resulting in inaccurate parasitics extracted; (3) the TRL method requires at least three DUTs to cover a wide frequency range; and (4) all current methods use an approximate open pad.

Accordingly, what is needed is a test structure and method for improving the accuracy of de-embedding parasitics.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
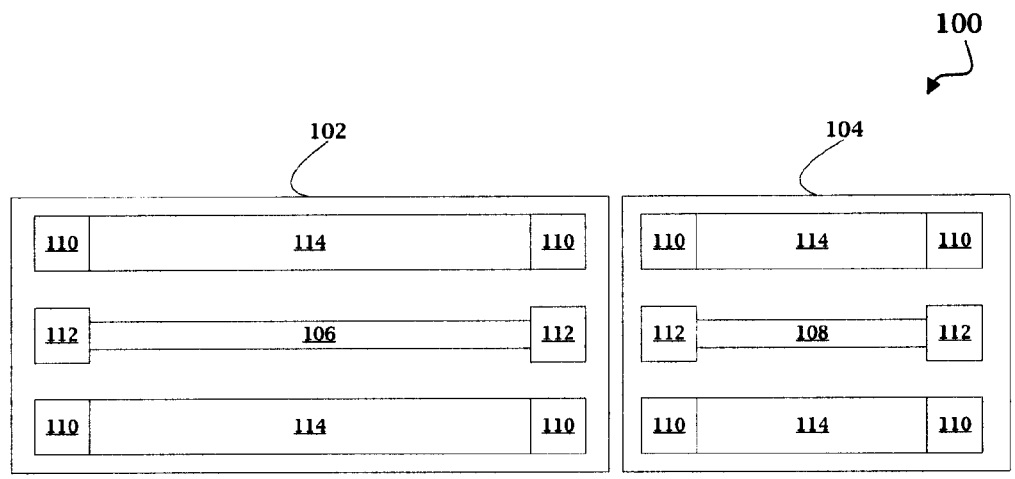
FIG. 1 is a block diagram of a test structure for de-embedding parasitics according to one embodiment of the present invention.

The present disclosure relates generally to the field of integrated circuits testing, and more particularly, to a system and method for de-embedding parasitics for on-wafer devices.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 4B, a test structure 100 and a method 400 for accurately de-embedding parasitics for on-wafer devices are collectively described below. It is understood that additional features can be added in the test structure 100, and some of the features described below can be replaced or eliminated, for additional embodiments of the test structure. It is further understood that additional steps can be provided before, during, and after the method 400 described below, and some of the steps described below can be replaced or eliminated, for additional embodiments of the method. The present embodiment of test structure 100 and method 400 significantly improves de-embedding accuracy of test structure parasitics, such as resistance, inductance, and capacitance.

Referring to FIG. 1, the test structure 100 comprises a first dummy component 102, a second dummy component 104, a first transmission line 106, a second transmission line 108, test pads 110 and 112, and connecting lines 114.

The first dummy component 102 is coupled with the second dummy component 104. The first dummy component 102 comprises the first transmission line 106. The second dummy component 104 comprises the second transmission line 108. In the present embodiment, the second transmission line 108 has length L and the first transmission line 106 has length 2L (i.e., the first transmission line is two times longer than the second transmission line). The first and second transmission lines 106, 108 also comprise the same width and lie on or within the same semiconductor wafer. It is understood that the first dummy structure 106 may comprise the first transmission line 106 with length L, and the second dummy structure 108 may comprise the second transmission line 108 with length 2L (i.e., the second transmission line is two times longer than the first transmission line). Further, in alternate embodiments, the first and second transmission lines 106, 108 may comprise varying widths.

In test structure 100, the first transmission line 106 and second transmission line 108 are co-linear and may comprise any conducting material, such as aluminum, copper, aluminum-copper alloys, aluminum alloys, copper alloys, other metals, polysilicon, any other material, and/or combinations thereof. In alternate embodiments, the first and second transmission line may not be co-linear.

Both the first and second dummy components 102, 104 further comprise the test pads 110, 112 and connecting lines 114. In the preferred embodiment, the test pads 110 and 112 are implemented in a ground-signal-ground (GSG) test configuration; and the test pads 110 comprise ground test pads, and the test pads 112 comprise signal test pads. However, it is understood that, in alternate embodiments, the test structure 100 may comprise other testing configurations, such as ground-signal (GS), ground-signal-ground-signal-ground (GSGSG), and/or any other suitable testing configurations. The ground test pads 110 are electrically connected to one another via connecting lines 114. The signal test pads 112 are electrically connected via the first transmission line 106 and the second transmission line 108. Further, the test pads 110, 112 and connecting lines 114 may comprise any conducting material, such as aluminum, copper, aluminum-copper alloys, aluminum alloys, copper alloys, other metals, polysilicon, any other material, and/or combinations thereof. In alternate embodiments, the ground test pads 110 and signal test pads 112 may be electrically connected in other configurations, such as the ground test pads electrically connected via the first and second transmission lines, the signal test pads connected via connecting lines, and/or the ground and signal test pads electrically connected via the first and second transmission lines.

Figure 2:
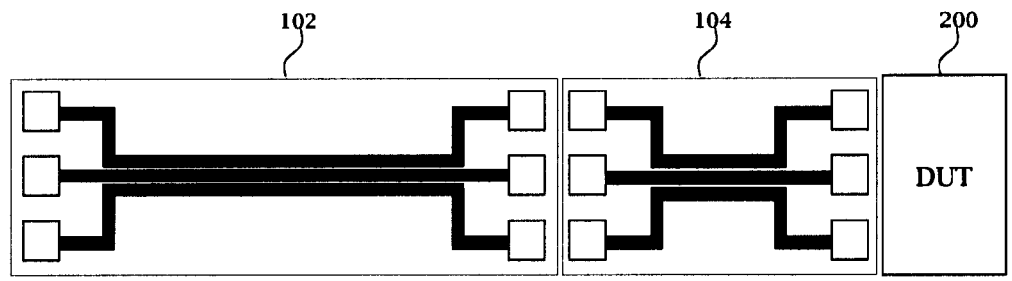
FIG. 2 is a top view of a test structure for de-embedding parasitics coupled with a device-under-test according to one embodiment of the present invention.

FIG. 2 provides a top view of the test structure 100 coupled with a device-under-test (DUT) 200. In FIG. 2, the first dummy component 102 couples with the second dummy component 104, and the second dummy component couples with the DUT 200. In the preferred embodiment, the test structure 100 is coupled with a co-planar wave guide (CPW). In alternate embodiments, the DUT 200 may be any other suitable DUT, such as a resistor, capacitor, diode, inductor, any other device on/in an integrated circuit, other co-planar wave guides, combinations thereof, and/or the integrated circuit itself. Further, as noted above, in alternate embodiments, the arrangement of the first dummy component 102 and second dummy component 104 may be reversed, where the first dummy component 102 (comprising the first transmission line 106 of length 2L) may be coupled with the DUT 200 and then further coupled with the second dummy component 104 (comprising the second transmission line 108 of length L). In addition, though FIG. 2 shows the test structure 100 coupled with the DUT 200 in one location, in alternate embodiments, the test structure 100 may be coupled at multiple locations to the DUT 200. Also, in the present embodiment, only one test structure 100 couples with the DUT 200; however, in alternate embodiments, multiple test structures 100 may be coupled with the DUT 200.

The test structure 100 couples with the DUT 200 in order to determine the intrinsic characteristics of the DUT 200. In the present embodiment, during testing, the DUT 200 is coupled with the first dummy component 102 and the second dummy component 104, which are further connected to external testing equipment. Though the measured physical/electrical properties should accurately represent those of the DUT 200 alone, the test structure 100 contributes physical/electrical characteristics, known as "parasitics" (e.g., resistance, capacitance, and inductance from the transmission lines and test pads), that ultimately contribute to the measured characteristics of the DUT. In the present embodiment, the first and second transmission lines 106, 108 and signal test pads 112 of the first and second dummy components 102, 104 contribute parasitics to the measured characteristics of the DUT 200. In alternate embodiments, the ground test pads 110 and connecting lines 114 may also contribute parasitics to the overall measured physical/electrical characteristics of the DUT 200.

Figure 3:
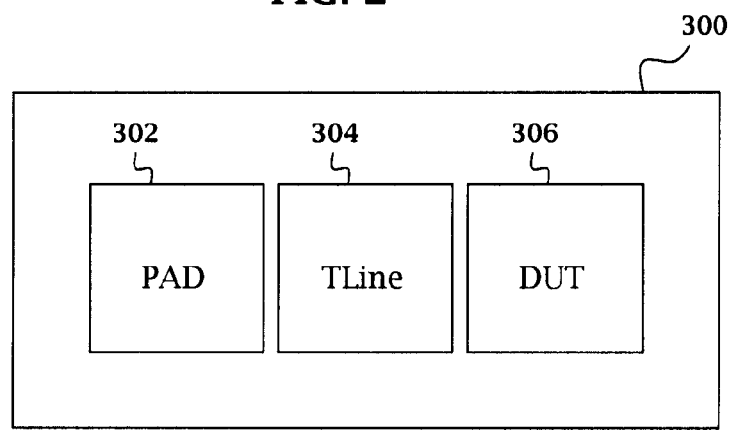
FIG. 3 is a block diagram of a test structure coupled with a device-under-test according to one embodiment.

FIG. 3 provides a simple block diagram reflecting each portion that contributes physical/electrical characteristics to the measured characteristics of the DUT 200. Block 300 represents the measured characteristics of the DUT 200. The external measurements from the DUT 200 may include parasitics from the signal test pads 112, the first transmission line 106, and the second transmission line 108, and physical/electrical characteristics of the DUT 200. In FIG. 3, block 302 represents the parasitics contributed by the test pads 112; block 304 represents the parasitics contributed by the transmission lines 106, 108; and block 306 represents the intrinsic characteristics of the DUT 200. In alternate embodiments, block 302 may include parasitics contributed by test pads 110, and/or block 304 may include parasitics contributed by connecting lines 114. To obtain the intrinsic characteristics of the DUT 200 alone, the characteristics of block 306 alone, the contributions from blocks 302 and 304 must be factored out or extracted (i.e., de-embedded) from the measured characteristics of the DUT (block 300). In other words, the parasitics from the signal test pads 112, the first transmission line 106, and the second transmission line 108 must be de-embedded. It is understood that in alternate embodiments the parasitics from the ground test pads 110 and connecting lines 114 may also contribute to the measured electrical characteristics of the DUT 200 and may need to be de-embedded.

Figure 4A:
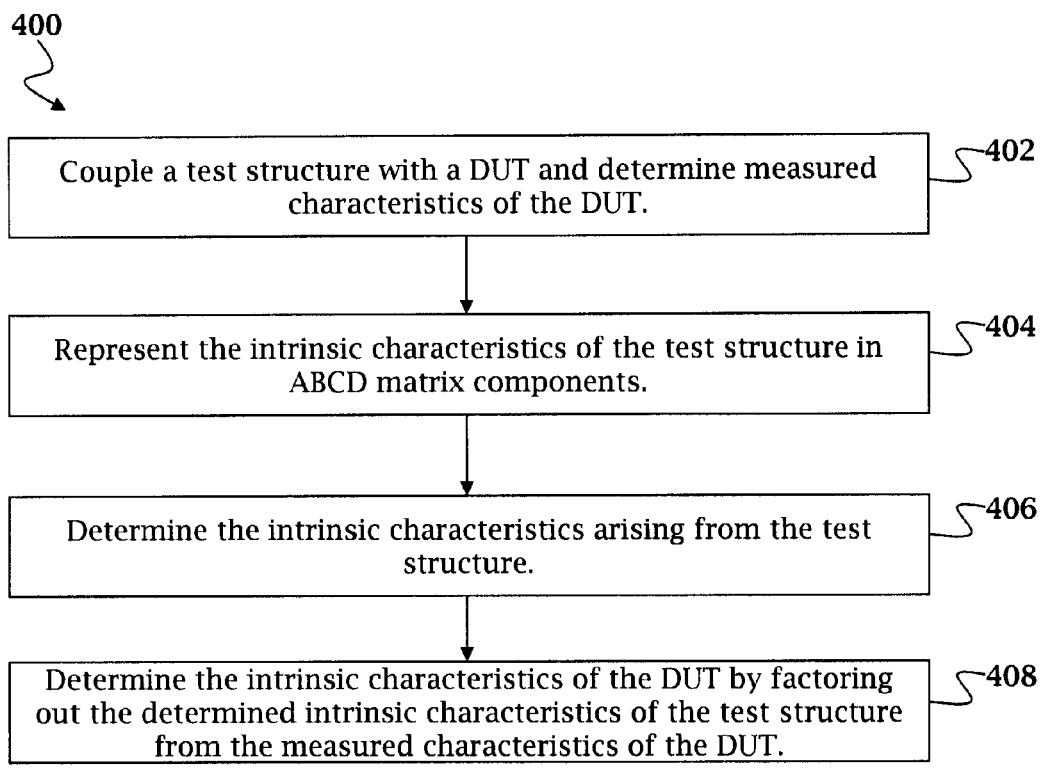
FIG. 4A is a flow chart of a method for de-embedding parasitics according to aspects of the present invention.

FIG. 4A is a flow diagram of one embodiment of a de-embedding process for accurately obtaining the intrinsic characteristics of the DUT 200 alone. In operation, the test structure 100 utilizes the method 400 to determine the intrinsic characteristics of the DUT 200 alone by de-embedding the parasitics (i.e., the resistance, capacitance, inductance, etc. arising from the test pads 110, 112 and transmission lines 106, 108).

Referring to FIGS. 1-4B, the method 400 begins with step 402, which involves coupling the test structure 100, comprising at least two dummy components 102, 104, at least two transmission lines 106, 108, and at least one test pad 110, 112, to the DUT 200. Once the test structure 100 is coupled with the DUT 200, the characteristics of the DUT 200 are measured. As noted above, parasitics from the test structure 100 contribute to the measured characteristics of the DUT 200. Accordingly, such parasitics contributed by the test structure 100 must be determined and extracted to obtain an accurate measurement for the intrinsic characteristics of the DUT 200.

In step 404, the intrinsic characteristics of the test structure are represented and decomposed into ABCD matrix components, which requires decomposing the parasitics contributed by the first dummy component 102 and second dummy component 104 into ABCD matrix components. The parasitics of the first dummy component 102, which comprises the first transmission line 106 of length 2L, may be represented by [2L]. The parasitics of the second dummy component 104, which comprises the second transmission line 108 of length L, may be represented by [L]. In alternate embodiments, the first dummy component 102 may comprise a transmission line of length L and be represented by [L], and the second dummy component 104 may comprise a transmission line of length 2L and be represented by [2L].

Figure 4B:
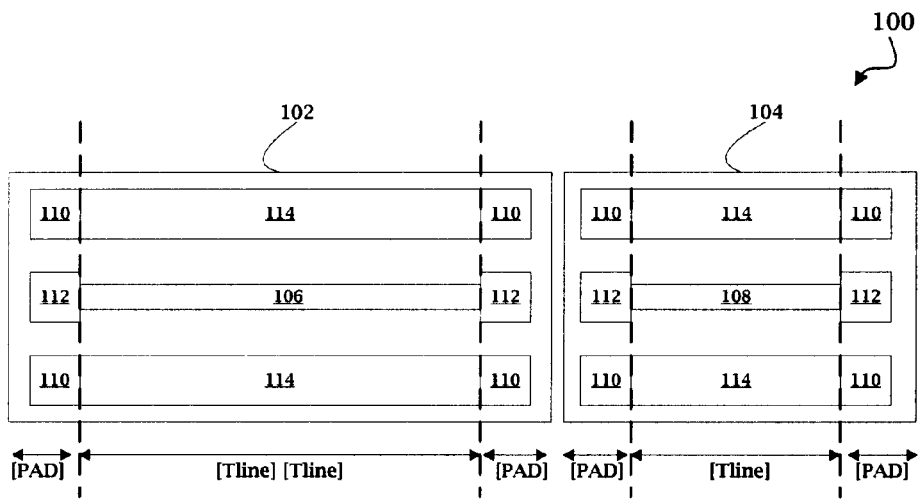
FIG. 4B is a block diagram of a test structure for de-embedding parasitics according to one embodiment of the present invention.

With reference to FIG. 4B, the test structure 100 is divided into separate portions that contribute to the overall parasitics arising from the first and second dummy components 102, 104. As noted above, the intrinsic characteristics of the test structure 100 arise from the signal test pads 112, the first transmission line 106, and the second transmission line 108, which must be factored out or extracted (i.e., de-embedded). In the present embodiment, the parasitics contributed by a single test pad are represented by the matrix [PAD], and the parasitics contributed by a transmission line of length L are represented by the matrix [TLine]. In alternate embodiments, [PAD] may represent parasitics contributed by multiple test pads, and [TLine] may represent parasitics contributed by multiple transmission lines of length L or a transmission line of a length other than L.

In the present embodiment, the parasitics contributed from the first and second dummy components 102, 104 arise from the first and second transmission lines 106, 108 and the signal test pads 112. So, with reference to FIG. 4B, the parasitics resulting from the second dummy component 104, [L], comprise the parasitics of the first signal test pad 112 ([PAD]), the second transmission line 108 of length L ([TLine]), and the second signal test pad 112 ([PAD]); and the parasitics resulting from the first dummy component 102, [2L], comprise the parasitics of the first signal test pad 112 ([PAD]), the first transmission line 106 of length 2L ([TLine][TLine]), and the second signal test pad 112 ([PAD]). It is understood that, in alternate embodiments, parasitics may arise from the ground test pads 110 and connecting lines 114 and may similarly be represented by matrices [PAD] or [TLine]. Thus, when the first and second dummy components 102, 104 are decomposed into ABCD matrix components, the following formulas represent the contributed parasitics:

$$[L]=[PAD][TLine][PAD]; \text{ and} \quad (1)$$

$$[2L]=[PAD][TLine][TLine][PAD], \quad (2)$$

where [PAD] is a matrix in ABCD matrix components representing the parasitics contributed by one test pad and [TLine] is a matrix in ABCD matrix components representing the parasitics contributed by a transmission line of length L.

In step 406, the intrinsic characteristics of the test structure, the parasitics, are determined. By manipulating equations (1) and (2) above, [PAD] and [TLine] may be solved for and represented by the following equations:

$$[PAD][PAD]=[[L]^{-1}[2L][L]^{-1}]^{-1} \quad (3)$$

$$[TLine]=[PAD]^{-1}[L][PAD]^{-1} \quad (4)$$

From equation (3), [PAD] is easily calculated by plugging in measurable data. Then, [TLine] is determined. When equations (3) and (4) are solved, all parasitics of the test structure 100 contributing to the measured characteristics of the DUT 200 (measured in step 402) are known.

In step 408, the intrinsic characteristics of the DUT are determined. This may be accomplished by factoring out or extracting the intrinsic characteristics of the test structure 100, determined in step 406, from the measured characteristics of the DUT 200 that were determined in step 402. For example, with reference to FIG. 3, blocks 302 and 304, the parasitics contributed by the test pads and transmission lines of the test structure 100, are extracted from block 300, the measured characteristics of the DUT 200, to obtain block 306, the intrinsic characteristics of the DUT 200 alone.

Overall, the disclosed embodiments provide one or more of the following advantages: (1) in the preferred embodiment, only two transmission lines are required; (2) ABCD matrix components effectively solve all parasitics (e.g., resistance, inductance, and capacitance); (3) the layout size required by test structures is minimized (in the preferred embodiment, the test structure comprises only two dummy components); (4) model fitting to obtain the parasitics (or de-embedding parameters) is no longer required; (5) unlike the open-thru, open-short, and TRL de-embedding methods, an approximate open pad is not required for de-embedding purposes; (6) the proposed method is easy to use and the de-embedding results are essentially displayed right after experimental measurements are taken; and (7) the proposed method and system provides very good de-embedding accuracy, specifically when de-embedding parasitics contributed by test pads and transmission lines of a test structure.

In summary, a method and system are provided for de-embedding an on-wafer device. This method and system effectively determines the parasitics contributed by a test structure to measured characteristics of a DUT. Ultimately, this results in improved accuracy in determining intrinsic characteristics of a DUT.

In one embodiment, a wafer comprises at least one die comprising a plurality of devices; and at least one test structure for de-embedding at least one of the plurality of devices, wherein the at least one test structure further comprises: a first dummy component comprising a first transmission line; a second dummy component comprising a second transmission line, wherein the second dummy component is coupled with the first dummy component; and at least one test pad electrically connected to the first transmission line and at least one test pad electrically connected to the second transmission line. In some embodiments, the first dummy component and the second dummy component each further comprise at least one connecting line and at least one test pad electrically connected to the at least one connecting line.

In some embodiments, the second dummy component coupled with the first dummy component is further coupled with a device-under-test (DUT). In some embodiments, the first transmission line has length 2L and the second transmission line has length L; and/or the first transmission line and the second transmission line are the same width. In some embodiments, the first transmission line and the second transmission line are on the same substrate. And, in some embodiments, the first transmission line and the second transmission line comprise conducting material.

In some embodiments, the at least one test pad electrically connected to the first transmission line comprises two signal test pads electrically connected to the first transmission line; and/or the at least one test pad electrically connected to the second transmission line comprises two signal test pads electrically connected to the second transmission line. In some embodiments, the at least one test pad electrically connected to the at least one connecting line comprises two ground test pads electrically connected to the at least one connecting line.

In one embodiment, a method for de-embedding an on-wafer device comprises representing the intrinsic characteristics of a test structure using a set of ABCD matrix components; determining the intrinsic characteristics arising from the test structure; and using the determined intrinsic characteristics of the test structure to produce a set of parameters representative of the intrinsic characteristics of a device-under-test ("DUT").

In some embodiments, representing the intrinsic characteristics of a test structure comprises representing intrinsic characteristics of a first dummy component and a second dummy component in ABCD matrix components, wherein the first dummy component and the second dummy component each comprise at least one test pad and at least one transmission line.

In some embodiments, determining the intrinsic characteristics arising from the test structure comprises determining the intrinsic characteristics arising from the at least one test pad of the first dummy component and the second dummy component; and determining the intrinsic characteristics arising from the at least one transmission line of the first dummy component and the second dummy component.

In some embodiments, determining the intrinsic characteristics arising from the at least one test pad comprises representing the intrinsic characteristics of the at least one test pad by matrix [PAD] in ABCD matrix components; and/or determining the intrinsic characteristics arising from the at least one transmission line comprises representing the intrinsic characteristics of the at least one transmission line by matrix [TLine] in ABCD matrix components, wherein [TLine] represents the intrinsic characteristics of a transmission line comprising length L.

In some embodiments, representing the intrinsic characteristics of the first dummy component and the second dummy component in ABCD matrix components comprises representing the intrinsic characteristics of the first dummy component by matrix [2L], wherein [2L]=[PAD][TLine][TLine][PAD] and the at least one transmission line of the first dummy component is two times longer than the at least one transmission line of the second dummy component; and representing the intrinsic characteristics of the second dummy component by matrix [L], wherein [L]=[PAD][TLine][PAD] and the at least one transmission line of the second dummy component comprises length L.

In some embodiments, determining the intrinsic characteristics arising from the at least one test pad further comprises manipulating matrices [2L] and [L], wherein $[PAD][PAD]=[[L]^{-1}[2L][L]^{-1}]^{-1}$; and/or determining the intrinsic characteristics arising from the at least one transmission line further comprises manipulating matrices [2L] and [L], wherein $[TLine]=[PAD]^{-1}[L][PAD]^{-1}$.

In some embodiments, using the determined intrinsic characteristics of the test structure to produce a set of parameters representative of the intrinsic characteristics of a device-under-test ("DUT") comprises factoring out the determined intrinsic characteristics arising from the at least one test pad and the at least one transmission line of the first dummy component and the second dummy component from measured characteristics of the DUT.

In yet another embodiment, a test structure for de-embedding an on-wafer device comprises a first dummy component, wherein the first dummy component comprises a first transmission line of length L; a second dummy component coupled with the first dummy component, wherein the second dummy component comprises a second transmission line of length 2L; and a device-under-test coupled with the first dummy component and/or the second dummy component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer comprising:
   at least one die comprising a plurality of devices; and
   at least one test structure for de-embedding at least one of the plurality of devices, wherein the at least one test structure further comprises:
   a first dummy component comprising a first transmission line;
   a second dummy component comprising a second transmission line, wherein the second dummy component is coupled with the first dummy component and the second transmission line is co-linear with the first transmission line; and
   at least one test pad electrically connected to an end of the first transmission line and at least one test pad electrically connected to an end of the second transmission line, the at least one test pad electrically connected to the end of the first transmission line being adjacent to the at least one test pad electrically connected to the end of the second transmission line, wherein the first transmission line is positioned only within the first dummy component and the second transmission line is positioned only within the second dummy component.

2. The test structure of claim 1 wherein the first dummy component and the second dummy component each further comprise at least one connecting line and at least one test pad electrically connected to the at least one connecting line.

3. The test structure of claim 2 wherein the at least one test pad electrically connected to the at least one connecting line comprises two ground test pads electrically connected to the at least one connecting line.

4. The test structure of claim 1 wherein the second dummy component coupled with the first dummy component is further coupled with a device-under-test (DUT).

5. The test structure of claim 1 wherein the first transmission line has length 2L and the second transmission line has length L.

6. The test structure of claim 1 wherein the first transmission line and the second transmission line are the same width.

7. The test structure of claim 1 wherein the first transmission line and the second transmission line are on the same wafer.

8. The test structure of claim 1 wherein the first transmission line and the second transmission line comprise conducting material.

9. The test structure of claim 1 wherein the at least one test pad electrically connected to the first transmission line comprises two signal test pads electrically connected to the first transmission line.

10. The test structure of claim 1 wherein the at least one test pad electrically connected to the second transmission line comprises two signal test pads electrically connected to the second transmission line.

11. A method for de-embedding an on-wafer device comprising:
    providing a device-under-test ("DUT") fabricated according to a design specification and a test structure having a first dummy component with at least one test pad and at least one transmission line;
    determining intrinsic characteristics arising from the test structure; and
    using the determined intrinsic characteristics of the test structure to produce a set of parameters representative of the intrinsic characteristics of the DUT by factoring out the determined intrinsic characteristics arising from one of the at least one test pad and the at least one transmission line of the test structure; and
    modifying the design specification if the intrinsic characteristics of the DUT do not comply with the design specification.

12. The method of claim 11, further comprising:
    representing the intrinsic characteristics of a test structure using a set of ABCD matrix components.

13. The method of claim 12 wherein representing the intrinsic characteristics of a test structure comprises representing intrinsic characteristics of the first dummy component and a second dummy component in ABCD matrix components, wherein the second dummy component comprises at least one test pad and at least one transmission line.

14. The method of claim 13 wherein representing the intrinsic characteristics of the first dummy component and the second dummy component in ABCD matrix components comprises:
   representing the intrinsic characteristics of the first dummy component by matrix [2L], wherein [2L]=[PAD][TLine][TLine][PAD] and the at least one transmission line of the first dummy component is two times longer than the at least one transmission line of the second dummy component; and
   representing the intrinsic characteristics of the second dummy component by matrix [L], wherein [L]=[PAD][TLine][PAD] and the at least one transmission line of the second dummy component comprises length L.

15. The method of claim 12 wherein determining the intrinsic characteristics arising from the test structure comprises:
   determining the intrinsic characteristics arising from the at least one test pad of the first dummy component and the second dummy component; and
   determining the intrinsic characteristics arising from the at least one transmission line of the first dummy component and the second dummy component.

16. The method of claim 15 wherein determining the intrinsic characteristics arising from the at least one test pad comprises representing the intrinsic characteristics of the at least one test pad by matrix [PAD] in ABCD matrix components.

17. The method of claim 15 wherein determining the intrinsic characteristics arising from the at least one transmission line comprises representing the intrinsic characteristics of the at least one transmission line by matrix [TLine] in ABCD matrix components, wherein [TLine] represents the intrinsic characteristics of a transmission line comprising length L.

18. The method of claim 15 wherein determining the intrinsic characteristics arising from the at least one test pad further comprises manipulating matrices [2L] and [L], wherein $[PAD][PAD]=[[L]^{-1}[2L][L]^{-1}]^{-1}$.

19. The method of claim 15 wherein determining the intrinsic characteristics arising from the at least one transmission line further comprises manipulating matrices [2L] and [L], wherein $[TLine]=[PAD]^{-1}[L][PAD]^{-1}$.

20. A test structure for de-embedding an on-wafer device comprising:
   a first dummy component, wherein the first dummy component comprises a first transmission line of length L;
   a second dummy component coupled with the first dummy component, wherein the second dummy component comprises a second transmission line of length 2L, the second transmission line being co-linear with the first transmission line, wherein the first transmission line is positioned only within the first dummy component and the second transmission line is positioned only within the second dummy component; and
   a device-under-test electrically coupled with the first dummy component and/or the second dummy component.

* * * * *